US011942925B2

(12) United States Patent
Heckroth et al.

(10) Patent No.: US 11,942,925 B2
(45) Date of Patent: Mar. 26, 2024

(54) MANAGEMENT OF MULTIPLE SWITCHING-SYNCHRONIZED MEASUREMENTS USING COMBINED PRIORITIZED MEASUREMENT AND ROUND-ROBIN SEQUENCE MEASUREMENT

(71) Applicant: Skyworks Solutions, Inc., Irvine, CA (US)

(72) Inventors: James Edward Heckroth, Austin, TX (US); Ion Constantin Tesu, Austin, TX (US)

(73) Assignee: Skyworks Solutions, Inc., Irvine, CA (US)

( * ) Notice: Subject to any disclaimer, the term of this patent is extended or adjusted under 35 U.S.C. 154(b) by 0 days.

(21) Appl. No.: 18/141,945

(22) Filed: May 1, 2023

(65) Prior Publication Data
US 2023/0421146 A1 Dec. 28, 2023

Related U.S. Application Data

(63) Continuation of application No. 18/091,216, filed on Dec. 29, 2022, now abandoned, which is a continuation of application No. 17/544,708, filed on Dec. 7, 2021, now Pat. No. 11,575,369.

(60) Provisional application No. 63/126,050, filed on Dec. 16, 2020.

(51) Int. Cl.
*H03K 3/00* (2006.01)
*H02M 1/084* (2006.01)
*H02M 7/537* (2006.01)
*H03K 17/0812* (2006.01)
*H03K 17/16* (2006.01)
*H03K 17/687* (2006.01)

(52) U.S. Cl.
CPC .... *H03K 17/08122* (2013.01); *H02M 1/0845* (2013.01); *H02M 7/537* (2013.01); *H03K 17/163* (2013.01); *H03K 17/687* (2013.01)

(58) Field of Classification Search
None
See application file for complete search history.

(56) References Cited

U.S. PATENT DOCUMENTS 9,698,654 B2 7/2017 Santos et al.
11,057,029 B2 7/2021 Westwick et al.
(Continued)

OTHER PUBLICATIONS

St, "AN2738 Application Note L6390 Half-Bridge Gate Driver", Doc ID14589 Rev. 2, Aug. 2009, 54 pages.
(Continued)

*Primary Examiner* — Kenneth B Wells
(74) *Attorney, Agent, or Firm* — Knobbe, Martens, Olson & Bear, LLP

(57) ABSTRACT

A method for operating a gate driver system includes measuring a first parameter according to a first priority schedule synchronously to a first edge of a switching signal generated by a gate driver integrated circuit and having a variable duty cycle. The method includes after measuring the first parameter of the gate driver system and prior to a second edge of the switching signal, measuring at least a second parameter of the gate driver system according to a first round-robin schedule synchronously to the first edge of the switching signal.

20 Claims, 12 Drawing Sheets

(56) References Cited

U.S. PATENT DOCUMENTS 11,362,646 B1 * 6/2022 Tesu .................... H03K 17/567
11,575,369 B2 2/2023 Heckroth et al.

OTHER PUBLICATIONS

Texas Instruments, "UCC5870-Q1 Functional Safety Compliant 15-A Isolated IGBT/SiC MOSFET Gate Driver with Advanced Protection Features for Automotive Applications", UCC5870-Q1, SLUSD86B Jun. 2020, revised Nov. 2020, 112 pages.

* cited by examiner

MANAGEMENT OF MULTIPLE SWITCHING-SYNCHRONIZED MEASUREMENTS USING COMBINED PRIORITIZED MEASUREMENT AND ROUND-ROBIN SEQUENCE MEASUREMENT

CROSS-REFERENCE TO RELATED APPLICATION(S)

This application is a continuation of U.S. application Ser. No. 18/091,216, entitled "MANAGEMENT OF MULTIPLE SWITCHING-SYNCHRONIZED MEASUREMENTS USING COMBINED PRIORITIZED MEASUREMENT AND ROUND-ROBIN SEQUENCE MEASUREMENT," filed on Dec. 29, 2022, now abandoned, which is a continuation of U.S. application Ser. No. 17/544,708, entitled "MANAGEMENT OF MULTIPLE SWITCHING-SYNCHRONIZED MEASUREMENTS USING COMBINED PRIORITIZED MEASUREMENT AND ROUND-ROBIN SEQUENCE MEASUREMENT," filed on Dec. 7, 2021, which claims the benefit of U.S. Provisional Application No. 63/126,050, entitled "MANAGEMENT OF MULTIPLE SWITCHING-SYNCHRONIZED MEASUREMENTS USING COMBINED PRIORITIZED MEASUREMENT AND ROUND-ROBIN SEQUENCE MEASUREMENT," filed on Dec. 16, 2020, now U.S. Pat. No. 11,575,369, which application is incorporated herein by reference.

BACKGROUND

Field of the Invention

This disclosure is related to integrated circuits, and more particularly to measurement circuits in control systems.

Description of the Related Art

In a typical control application, a processor system provides one or more control signals for controlling a load system. During normal operation, a large DC or transient voltage difference may exist between a domain of the processor system and a domain of the load system, thus requiring an isolation barrier between the processor system and the load system. For example, one domain may be grounded at a voltage that is switching with respect to earth ground by hundreds or thousands of volts. Accordingly, an intermediate system includes isolation that prevents damaging currents from flowing between the processor system and the load system. Although the isolation prevents the processor system from being coupled to the load system by a direct conduction path, an isolation communications channel allows communication between the two systems using optical (opto-isolators), capacitive, inductive (transformers), or electromagnetic techniques. In at least one embodiment, the isolation communications channel blocks DC signals and only passes AC signals. The intermediate system typically uses a voltage converter and output driver to provide the control signal at voltage levels suitable for the load system.

Referring to FIG. 1, in an exemplary motor control application, system controller 100, which may be a microprocessor, microcontroller, or other suitable processing device, operates in a first domain (i.e., VDD1, e.g., 5 Volts (V)) and provides one or more signals for a high-power load system operating in a second domain (i.e., VDD3, e.g., 800 V). Gate driver products 102 each include an isolation barrier 130 and an isolation communications channel for safely communicating control signals from system controller 100 to drivers 106, which drive high-power drive devices 108 and 109 of a traction inverter used to convert DC power from a battery into AC power (e.g., three-phase power) to drive motor 120. Exemplary high-power drive devices include power metal-oxide-semiconductor field-effect transistors (MOSFETs), insulated-gate bipolar transistors (IGBTs), Gallium-Nitride (GaN) MOSFETs, Silicon-Carbide power MOSFETs, or other suitable devices able to deliver high currents over short periods of time.

Voltage converters 104 convert an available power supply voltage from VDD1 or VDD3 to a voltage level (i.e., VDD2, e.g., approximately 15 V) usable by the high-voltage side of gate driver products 102 and drivers 106. Note that in other embodiments, a single voltage converter 104 converts one power supply voltage from a first voltage level (e.g., VDD3) to multiple other voltage levels (e.g., VDD1 and VDD2) and/or provides multiple outputs of a particular voltage (e.g., multiple VDD2 outputs corresponding to multiple gate driver products 102). Gate driver products 102 output one or more signals used to provide a pulse-width modulated signal having a variable duty-cycle to drivers 106. Drivers 106 provide switch control signals at levels required by corresponding high-power drive devices 108 or 109 of the three-phase inverter. The load motor requires three-phase power at high power levels. Gate driver products 102 that correspond to high-power devices coupled to VDD3 (i.e., high-side inverter devices), are grounded at a voltage that is switching with respect to earth ground by the high voltage levels of VDD3. Typical high-power drive devices 108 and 109 of the three-phase inverter that are used to drive motor 120 require substantial turn-on voltages (e.g., voltages in the range of tens of Volts) and are susceptible to fault conditions that may damage those devices.

System controller 100 measures parameters of high-power drive devices 108 and 109 for use in control feedback and/or protection mechanisms. In general, a parameter measurement is synchronized to the corresponding switch control signal to reduce or eliminate measurement corruption due to switching transients. In an embodiment, system controller 100 uses multiple measurements (e.g., system voltages, sensed current, or sensed temperature) and different measurements may be used during the On-State of a high-power drive device versus the Off-State of the high-power drive device. Depending on the type of switching system and the nature of a measurement, it may be preferable to measure a specific parameter near the beginning, near the end, or near the center of a measurement in the On-State of the high-power drive device or the Off-State of the high-power drive device.

Since the control system uses a variable-duty-cycle control signal, the time available to complete measurements during the On-State or the Off-State also varies and the number of measurements that can be made is limited by duty cycle of the control signal. Thus, the switching environment presents a complex set of conflicting measurement requirements that may conflict and are not easily satisfied using existing measurement sequence management techniques. Accordingly, improved techniques for managing measurements in a switching environment are desired.

SUMMARY OF EMBODIMENTS OF THE INVENTION

In at least one embodiment, a method for managing measurements in a control system includes measuring a first parameter according to a first priority schedule synchronously to a first edge of a switching signal generated by a gate driver integrated circuit and having a variable duty cycle. The method includes, after measuring the first parameter of the gate driver system and prior to a second edge of the switching signal, measuring at least a second parameter of the gate driver system according to a first round-robin schedule synchronously to the first edge of the switching signal.

In at least one embodiment, a gate driver system includes a driver circuit of an integrated circuit and a controller circuit of the integrated circuit. The controller circuit is configured to cause the integrated circuit to measure a first parameter according to a first priority schedule synchronously to a first edge of a switching signal generated by the driver circuit and having a variable duty cycle, and after measuring the first parameter and prior to a second edge of the switching signal, to measure at least a second parameter according to a first round-robin schedule synchronously to the first edge of the switching signal.

In at least one embodiment, a method for managing measurements in a control system includes measuring a current through a high-power drive device and a voltage across the high-power drive device according to a first priority schedule synchronously to a first edge of a switching signal having a variable duty cycle. The method includes, after measuring the current and the voltage and prior to a next edge of the switching signal, measuring additional parameters according to a first round-robin schedule synchronously to the first edge of the switching signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

A measurement management technique utilizes a higher-priority measurement, referred to as a Measure-First measurement, followed by a Round-Robin measurement sequence to provide independent selection and management of measurements that are synchronized to an On-State of a switching signal (e.g., a state of a switching control signal corresponding to an enabled state of a high-power drive device) having a variable duty cycle or an Off-State of the switching signal (e.g., a state of a switching control signal corresponding to a disabled state of a high-power drive device). This approach has several advantages when compared to conventional single-measurement or Round-Robin measurement approaches. In at least one embodiment, the measurement management technique prioritizes an input (i.e., one parameter) while providing statistically distributed spacing of lower priority inputs (i.e., lower priority parameters) and adapts to the varying duty-cycle of the synchronizing switching signal. The parameters being measured will vary with the target application. In a gate driver application, exemplary parameters measured include a sensed current through a high-power drive device, a sensed battery voltage, a sensed temperature of the high-power drive device, a voltage on a control node of the high-power drive device, or other parameter. In at least one embodiment, the measurement management technique allows measurement near the beginning or near the end of a single On-State or Off-State of the switching signal. In at least one embodiment, the Measure-First measurement technique allows multiple measurements of the same input to be captured with various timing parameters for system characterization purposes.

Figure 1:
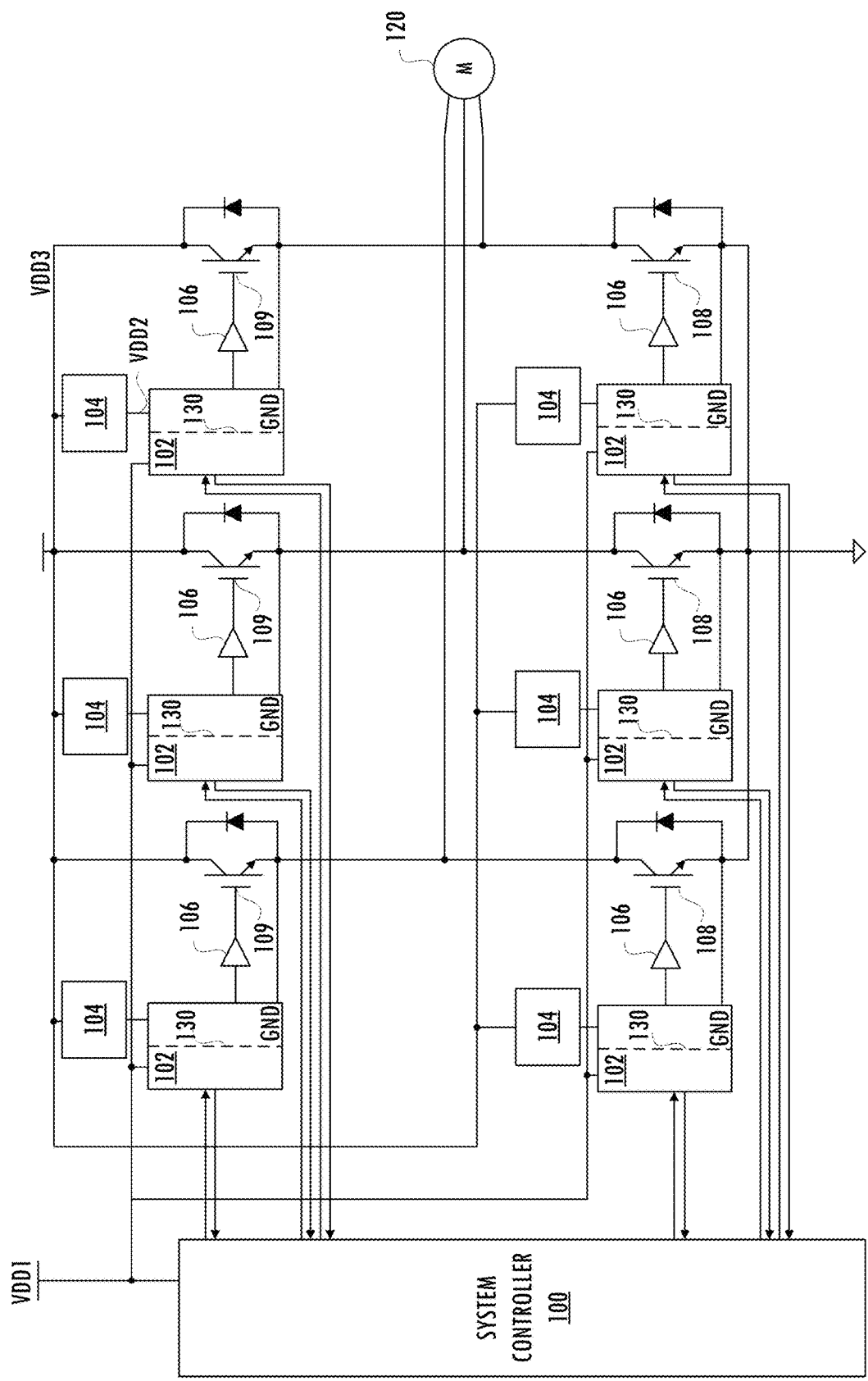
FIG. 1 illustrates a functional block diagram of a typical motor control system.
Figure 2:
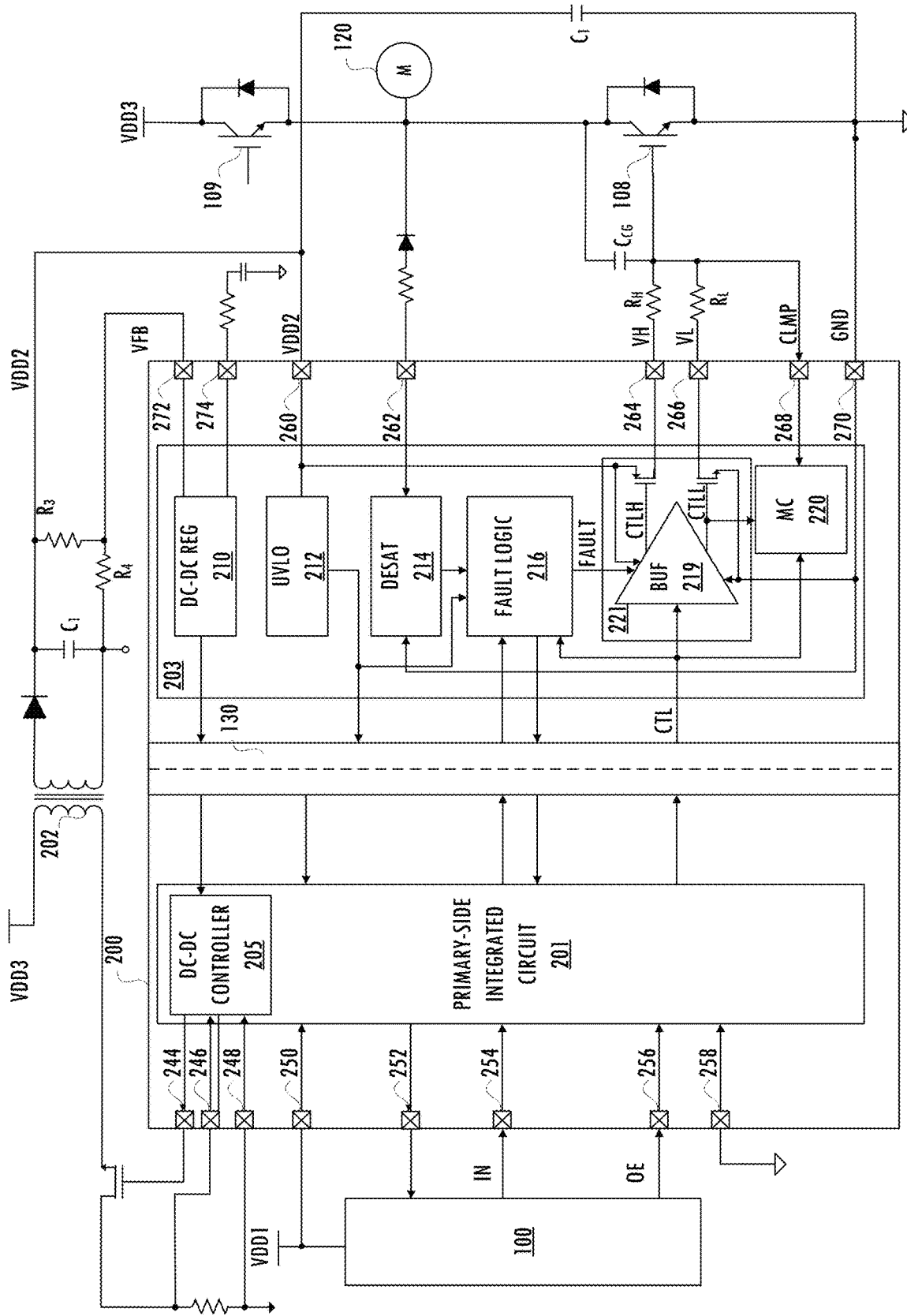
FIG. 2 illustrates a functional block diagram of an embodiment of a gate driver product including integrated voltage conversion and driver circuits.

Referring to FIGS. 1 and 2, in an exemplary motor control application, system controller 100 receives a voltage (e.g., VDD1, e.g., 3V) based on a first voltage domain and provides one or more signals for a high-power load system operating in a second domain (i.e., VDD3, e.g., hundreds of volts). Gate driver products 102 each include an isolation barrier and a communication channel for safely communicating control signals from system controller 100 across isolation barrier 130 to drive high-power drive device 108 and high-power drive device 109 of a traction inverter used to deliver three-phase power to motor 120.

In at least some embodiments, gate driver products 102 include integrated voltage regulation and control for an external transformer of a voltage converter. Referring to FIG. 2, by integrating the voltage regulation and DC-to-DC controller functions into driver product 200, which interacts with an external transformer 202, a high-Q inductor may be used in the voltage conversion, yet fewer other additional elements are required externally to the motor control system. By integrating voltage regulation into gate driver products 102, less printed circuit board routing is used. Accordingly, the system can achieve improved performance with reduced printed circuit board routing and system cost as compared to a system using an integrated circuit or chip-scale transformer and/or other voltage conversion techniques.

Referring to FIG. 2, in the exemplary motor control application, driver product 200 outputs at least one signal used to provide a pulse-width modulated signal having a variable duty-cycle to the gate of high-power drive device 108. In an exemplary embodiment, driver product 200 includes multiple integrated circuits configured as a multi-chip module in a single package. For example, driver product 200 includes primary-side integrated circuit 201 and secondary-side integrated circuit 203. Primary-side integrated circuit 201, receives control signal IN from system controller 100 and communicates the signal across isolation barrier 130 to secondary-side integrated circuit 203. In such embodiments, terminals 244, 246, 248, ..., 274 are pins of a package of the multi-chip module and are coupled to system controller 100 and other external elements, e.g., discrete resistors and capacitors.

Driver product 200 includes an isolation communications channel that facilitates communication between primary-side integrated circuit 201 and secondary-side integrated circuit 203. Any suitable communications technique that does not use a conductive path between the two sides may be used, e.g., optical, capacitive, inductive, or electromagnetic techniques. The isolation communications channel facilitates communication of signals between secondary-side integrated circuit 203 and system controller 100 using primary-side integrated circuit 201.

An exemplary isolation communications channel uses digital modulation (e.g., on-off keying modulation) to communicate one or more digital signals between primary-side integrated circuit 201 and secondary-side integrated circuit 203, although other communication protocols may be used. In general, on-off keying modulation is a form of amplitude-shift keying modulation that represents digital data as the presence or absence of a carrier wave or oscillating signal having a carrier frequency fc (e.g., 500 MHz-1 GHz). The presence of the carrier for a specified duration represents a binary one, while its absence for the same duration represents a binary zero. This type of signaling is robust for isolation applications because a logic '0' state sends the same signal (e.g., nothing) as when the primary side loses power and the device gracefully assumes its default state. That behavior is advantageous in driver applications because it will not accidentally turn on a load device being driven, even when the primary side loses power. However, the isolation communications channel may use other types of signals (e.g., pulse width modulated signals or other types of amplitude shift keying modulated signals). The digital modulation scheme used may be determined according to performance specifications (e.g., signal resolution) and environment (e.g., probability of transient events) of the target application.

DC-to-DC controller 205 and DC-to-DC regulator 210 of gate driver product 102 and external transformer 202 form a flyback converter, which is a buck-boost converter. DC-to-DC regulator 210 senses feedback voltage VFB (e.g., approximately 1.25V) provided by the secondary side of the transformer on terminal 272 and compares the sensed feedback voltage to a voltage reference. The comparison is compensated based on a voltage on terminal 274 and fed back to DC-to-DC controller 205. DC-to-DC controller 205 provides switch control signals (e.g., on terminal 244) to adjust a pulse-width modulated signal that drives the primary side of external transformer 202 to achieve a target voltage on the secondary side of external transformer 202 based on the feedback from DC-to-DC regulator 210 and voltage sensed on terminals 246 and 248. The voltage converter converts VDD3 to VDD2 so that gate driver product 102 can generate one or more control signals, i.e., a control signal (e.g., a control signal having voltage levels in the tens of volts) sufficient to drive a high-power drive device 108 without damaging gate driver product 102. In other embodiments of motor drive circuit 200, other power converter architectures and other reference voltage levels may be used.

An embodiment of secondary-side integrated circuit 203 includes driver 221, which generates one or more output control signals based on received control signal CTL received from primary-side integrated circuit 201, which receives control signal IN on terminal 254 from system controller 100. Driver 221 provides corresponding signals to terminals 264 and 266. Buffer 219 generates control signals CTLH and CTLL at appropriate signal levels for controlling pull-up and pull-down devices of driver 221, respectively. Buffer 219 may generate one control signal or two separate control signals for the pull-up device and the pull-down device based on received control signal CTL. External resistance $R_H$ adjusts the pull-up strength by $1/R_H$ independently from external resistance $R_L$ that adjusts the pull-down strength by $1/R_L$. Although received control signal CTL is illustrated as a single-ended signal based on input control signal CTL received from system controller 100 on terminal 254, note that in other embodiments, input control signal IN and received control signal CTL are differential signals. In general, signals illustrated herein as single-ended signals may be implemented as differential signals in other embodiments and signals illustrated herein as differential signals may be implemented as single-ended signals in other embodiments.

The pull-up strength and the pull-down strength of the output control signal provided to the control terminal of high-power drive device 108 can be independently adjusted from on-resistance $R_{DS(ON)}$ of the integrated pull-up output device coupled to terminal 264 using one or more passive elements. For example, resistance $R_H$ adjusts the pull-up strength. Resistor $R_L$ adjusts the pull-down strength of the signal provided to the gate of high-power drive device 108 via terminal 266 to have a strength different from the pull-up strength of the signal provided to the gate of high-power drive device 108. In a typical configuration, the pull-up time is slower than the pull-down time and resistances $R_H$ and $R_L$ will vary with specifications of the device (e.g., power MOSFET, IGBT, GaN MOSFET, Si-Carbide power MOSFET, etc.) used as high-power drive device 108.

In at least one embodiment, the isolation communications channel feeds back voltage information or fault information from secondary-side integrated circuit 203 to primary-side integrated circuit 201. Primary-side integrated circuit 201 or system controller 100 uses that information to adjust operating parameters or to generate one or more fault indicators that may be used for automatically handling faults by controlling output driver 221 accordingly. For example, secondary-side integrated circuit 203 includes modules that detect fault conditions associated with high-power drive devices, e.g., desaturation detector 214, and may also detect fault conditions associated with signaling from system controller 100. Fault indicator(s) may be used by secondary-side integrated circuit 203 to prevent damage to the high-power drive devices, load system, or user of the load system. In addition, secondary-side integrated circuit 203 may send an indication of a fault or associated diagnostic information to primary-side integrated circuit 201 and/or system controller 100.

In at least one embodiment, secondary-side integrated circuit 203 includes desaturation fault protection for high-power semiconductor devices, which protects against short-circuit current events that may destroy high-power drive device 108. This fault may result from an insufficient gate drive signal caused by inverter gate driver misbehavior, drive supply voltage issues, a short circuit in a power stage, or other excessive current or power dissipation of the high-power drive devices. Those events can substantially increase power consumption that quickly overheats and damages the corresponding high-power drive device. For example, when a short circuit current condition occurs in the exemplary motor drive application of FIGS. 1 and 2 (e.g., both devices of an individual inverter phase of a three-phase inverter are on), high current flows through high-power drive devices 108 and 109 and may destroy high-power drive devices 108 and 109. Accordingly, a fault detection technique detects this desaturation condition. Driver product 200 may send an indication thereof to system controller 100.

In at least one embodiment of gate driver product 102, desaturation fault protection turns off high-power drive device 108 following detection of the fault condition. In a typical application, terminal 262 is coupled to an external resistor and diode that are coupled to a terminal of high-power drive device 108 (e.g., the collector terminal of an IGBT or drain terminal of a MOSFET). In at least one embodiment of gate driver product 102, desaturation detection circuit 214 is enabled only while high-power drive device 108 is turned on. Desaturation detection circuit 214 senses when the collector-emitter voltage (or drain-to-source voltage, as the case may be) of high-power drive device 108 exceeds a predetermined threshold level (e.g., 7V). Note that the predetermined threshold level of desaturation detection circuit 214 may be externally adjusted based on the forward voltage of one or more diodes coupled to the desaturation resistor coupled to terminal 262 or based on the resistance of the desaturation resistor. In addition, a delay time may be introduced by coupling a capacitor between terminal 262 and an external power supply node.

In general, undervoltage lockout detector 212 prevents application of insufficient voltage to the control terminal of high-power drive device 108 by forcing the output on terminal 264 to be low during power-up of gate driver product 102. Undervoltage lockout detector 212 detects when the power supply voltage (e.g., VDD2 sensed using terminal 260) falls below a first predetermined undervoltage lockout threshold voltage and generates an indication thereof, which may be used to disable the lockout condition. Undervoltage lockout detector 212 also detects when the power supply voltage falls below a second predetermined undervoltage lockout threshold, which may be different from the first undervoltage lockout threshold voltage, to provide noise margin for the undervoltage lockout voltage detection. The indicator generated by undervoltage lockout detector 212 may be provided to system controller 100 using terminal 252. In at least one embodiment, driver product 200 includes a similar mechanism for an overvoltage condition.

Miller clamp 220 reduces effects of parasitic turn-on of high-power drive device 108 due to charging of the Miller capacitor (e.g., the collector-to-gate parasitic capacitor of an IGBT device or the drain-to-gate parasitic capacitor of a MOSFET in other embodiments of high-power device 108). That gate-to-collector coupling can cause a parasitic turn on of device 108 in response to a high transient voltage (e.g., a gate voltage spike) generated while high-power drive device 108 is turned off. A gate voltage spike is created when turning on another high-power drive device coupled to high-power drive device 108.

For example, when turning on upper high-power drive device 109, a corresponding lower high-power drive device 108 coupled to upper high-power drive device 109 experiences a voltage change $dV_{CE}/dt$ causing current flow into the gate drive terminal coupled to lower high-power drive device 108. In the absence of Miller clamp 220, this current would create a voltage drop across external resistance $R_L$ and would increase the gate-to-emitter voltage of a corresponding lower high-power drive device 108. If the gate-to-emitter voltage exceeds the device threshold voltage (e.g., 2 V), then high-power drive device 108 turns on. A similar parasitic turn-on event occurs when turning on high-power drive device 108 and the corresponding upper high-power drive device 109 is in an off state. Miller clamp 220 prevents parasitic turn-on by coupling terminal 268 to ground via a low-resistance switch that hinders or prevents the Miller capacitor current from developing a voltage sufficient to turn on the high-power drive device.

In some embodiments of driver product 200, Miller clamp 220 is not needed because a sufficiently sized gate capacitor coupled between the gate and emitter of each high-power drive device 108 shunts any Miller current and raises the level of the transient needed to parasitically turn on the device. However, such embodiments increase the gate charge voltage required to reach the threshold voltage of high-power drive device 108, increase the driver power, and increase switching losses of high-power drive device 108. In other embodiments of driver product 200 that do not use a Miller clamp circuit, the lower supply voltage is coupled to a negative voltage (e.g., −5 V) rather than ground. This configuration provides additional voltage margin to increase the likelihood that the parasitic turn-on transient does not raise the control terminal of high-power drive device 108 above its threshold voltage. However, this configuration increases cost by requiring an additional pin on the package and requiring generation of the negative voltage.

Upon detection of a fault condition by modules on secondary-side integrated circuit 203, fault logic 216 generates control signal FAULT, which may initiate shutdown of high-power drive device 108. Fault logic 216 reports the fault condition to system controller 100 via primary-side integrated circuit 201. Alternatively, fault logic 216 only reports the fault condition to primary-side integrated circuit 201 and high-power drive device 108 continues operation. Then, primary-side integrated circuit 201 reports the fault condition to system controller 100. Since a system may include multiple high-power drive devices (e.g., six high-power drive devices in the exemplary motor control application described herein), shutting down only one of these devices may harm the high-power drive devices or the load. Therefore, in response to detection of a fault, system controller 100 may initiate a shutdown of high-power drive device 108 only after detecting a predetermined number of faults over a particular period or other condition is satisfied. In at least one embodiment, system controller 100 initiates shutdown of high-power drive device 108 independently from any fault detection of driver product 200 (e.g., based on fault detection from another driver product 200 associated with another high-power drive device 108 or 109).

An abrupt shutoff of high-power drive device 108 may result in large di/dt induced voltages. Such voltage spikes could be damaging to high-power drive circuit 108 or the load. Accordingly, in response to a fault condition, system controller 100 or driver product 200 initiates a soft shutdown of high-power drive device 108 that slowly discharges the control terminal of high-power drive device 108 at a rate having a turn-off time longer than the regular turn-off time of the output control signal. For example, fault logic 216 receives an indicator from desaturation detection circuit 214 and generates control signal FAULT based thereon that initiates a soft shutdown. In other embodiments, fault logic 216 receives an indicator from one or more other fault detection circuits. Typical implementations of a soft-shutdown function in a driver product may use an additional terminal or at least one additional external resistor coupled to terminal 264 or terminal 266.

Figure 3:
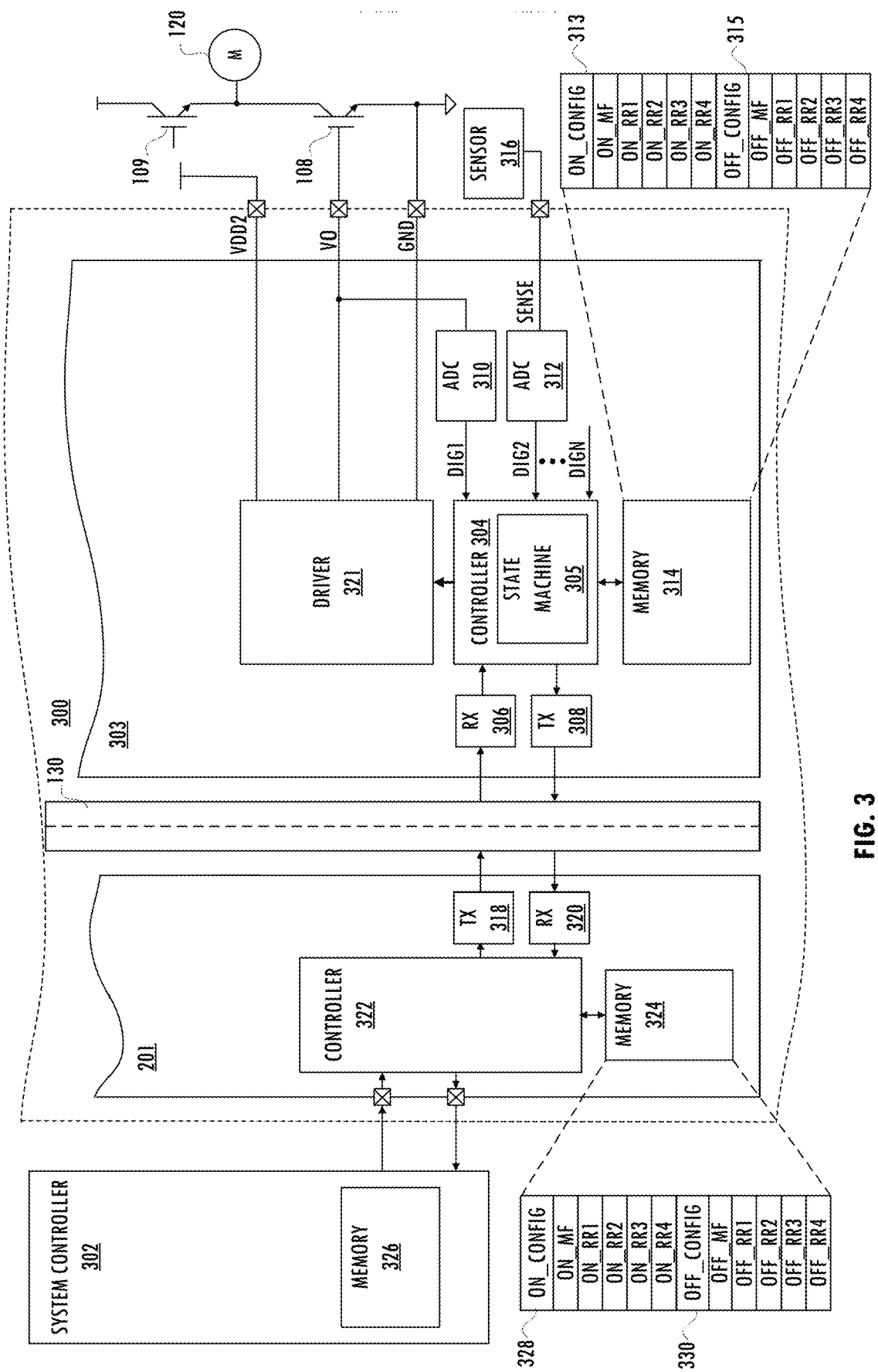
FIG. 3 illustrates a functional block diagram of a detailed portion of a gate driver product consistent with at least one embodiment of the invention.

Referring to FIG. 3, in at least one embodiment, a driver product includes a primary-side integrated circuit, isolation barrier, and isolation communications channel, as described above, and secondary-side integrated circuit 303 including gate driver features describe above. In at least one embodiment, secondary-side integrated circuit 303 of driver product 300 includes driver 321 coupled to terminal VO, which in some embodiments is the only terminal of driver product 300 that is coupled to the gate terminal of high-power drive device 108. In at least one embodiment, driver 321 is a variable strength driver that integrates the Miller clamp function or other fault detection circuits described above, and eliminates external resistors coupled to high power drive device 108 described above. Embodiments of variable strength driver 321 are described in U.S. patent application Ser. No. 17/138,091, entitled "VARIABLE CURRENT DRIVE FOR ISOLATED GATE DRIVERS," naming Ion C. Tesu, James E. Heckroth, Stefan N. Mastovich, John N. Wilson, Krishna Pentakota, Michael Ireland, Greg Ridsdale, and Lyric Jackson as inventors, filed on Dec. 30, 2020, which application is incorporated herein by reference now U.S. Pat. No. 11,362,646.

In at least one embodiment of secondary-side integrated circuit 303, controller 304 configures driver 321 to source current according to a normal turn-on profile in response to a switching control signal transitioning from a first value to a second value, configures driver 321 to sink current according to a normal turn-off profile in response to the switching control signal transitioning from the second value to the first value, or configures driver 321 to implement a soft-shutdown turn-off profile in response to the switching control signal having the second value and in response to a fault condition (e.g., a desaturation fault condition indicated by control signal FAULT).

In at least one embodiment, controller 304 receives the switching control signal from receiver 306, which receives the control signal across isolation barrier 130 from system controller 302 using controller 322, memory 324, and transmitter 318. Controller 304 provides digital signals to transmitter 308 for transmission across isolation barrier 130 to system controller 302 using receiver 320, controller 322, and memory 324. In at least one embodiment, one or more digital signals DIG1, DIG2, . . . , DIGn are digital values (i.e., measurements) received from corresponding analog-to-digital converter circuits for storage in memory 314 and used by controller 304 or transmission across the isolation barrier by transmitter 308.

In at least one embodiment, digital signal DIG1 is a digital value corresponding to a measurement received from analog-to-digital converter 310 and indicates a level of the output voltage on the control terminal of high-power drive device 108. In at least one embodiment, digital signal DIG2 is a digital value corresponding to a feedback signal generated by sensor 316, digitized by analog-to-digital converter 312, and indicates a sensed temperature level or battery voltage received from an external sensor coupled to gate driver product 300. In other embodiments, an analog-to-digital converter digitizes a level of a signal on terminal VO and digital comparison logic or controller 304 generates a measurement that is indicative of the comparison of gate-to-source voltage $V_{GS}$ of high-power drive device 108 to a predetermined threshold voltage. In an embodiment, controller 304 receives other digital signals corresponding to other signals sensed by secondary-side integrated circuit 303 (e.g., indicators of collector-emitter current of high-power drive device 108, indicator of battery voltage, indication of temperature of high-power drive device 108, or other system parameter). Controller 304 provides at least one measurement to transmitter 308, which communicates the measurement across the isolation barrier using a digital modulation scheme (e.g., on-off keying described above).

Referring to FIG. 3, in an embodiment, secondary-side integrated circuit 303 includes controller 304, which includes state machine 305, and memory 314 that are used to implement a flexible and adaptive measurement management technique that selects, prioritizes, and sequences measurements of different inputs that are synchronized to the switching control signal. In an embodiment, the switching control signal controls a corresponding high-power drive device 108. This technique utilizes a selectable high priority Measure-First measurement followed by a flexible Round-Robin measurement sequence described further below. In an embodiment, system controller 302 configures measurements for a target application by writing to on-state registers 328 and off-state registers 330 on the low-voltage side of the system, information for configuring measurements made by the secondary-side integrated circuit 303 on the high-voltage side of the system. A replica of that information is stored in on-state registers 313 and off-state registers 315 on the high-voltage side of the system. For example, an On-State measurement configuration is stored in ON CONFIG of on-state registers 313 and Off-State measurement configuration is stored in OFF CONFIG of off-state registers 315. Secondary-side integrated circuit 303 communicates information sensed by the high-voltage side of the system, to system controller 302 via the primary-side integrated circuit 201 for storage in memory 326. On-state registers 313 and 328 include register ON_MF, which stores the identity of a prioritized, Measure-First measurement to be made in the On-State and registers ON_RR1, ON_RR2, ON_RR3, and ON_RR4, which store the identities of Round-Robin prioritized inputs to be measured in the On-State. Similarly, off-state registers 315 and 330 include register OFF_MF, which stores the identity of a Measure-First prioritized measurement to be made in the Off-State and registers OFF_RR1, OFF_RR2, OFF_RR3, and OFF_RR4, which store the identities of Round-Robin prioritized inputs to be measured in the Off-State.

Figure 4:
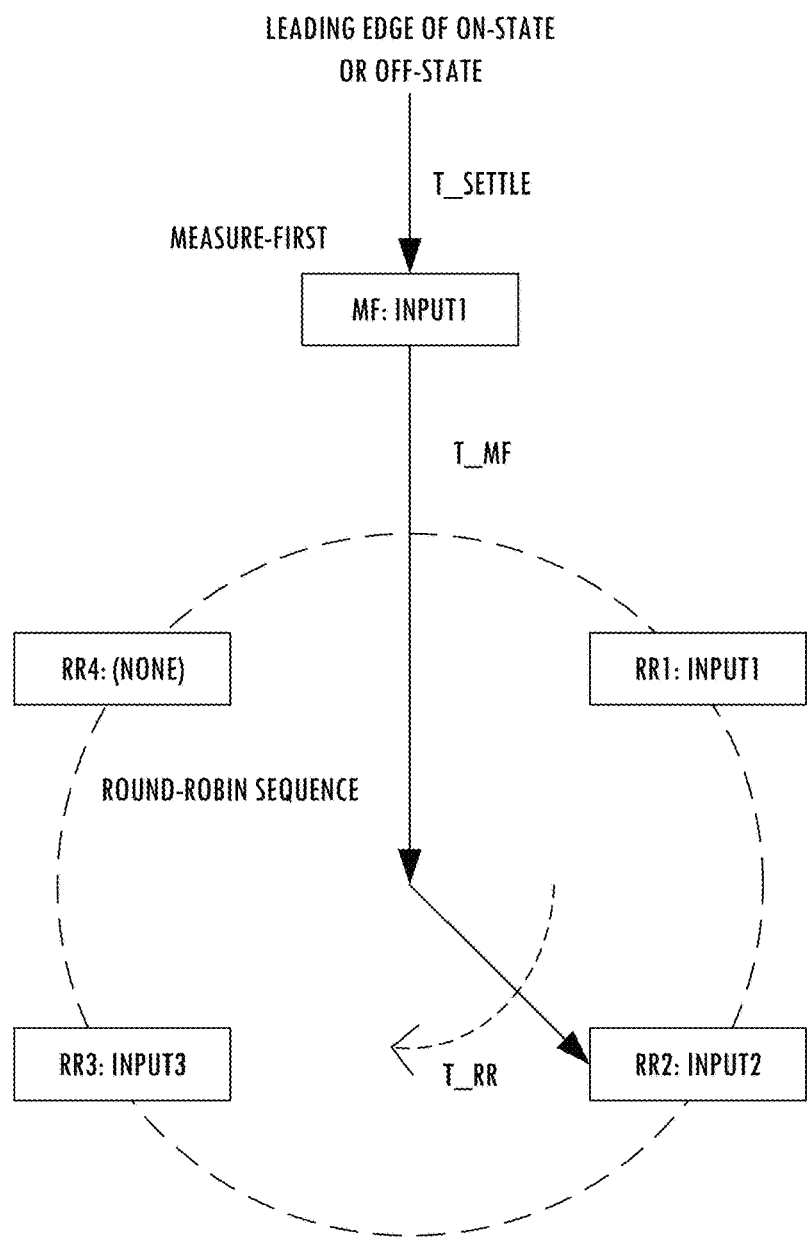
FIG. 4 illustrates a measurement management technique including Measure-First measurements preceding Round-Robin measurements consistent with at least one embodiment of the invention.

Referring to FIGS. 3 and 4, in at least one embodiment, system controller 302 specifies separate Measure-First and Round-Robin sequences for On-State and for Off-State measurements and this configuration is communicated to secondary-side integrated circuit 303. State machine 305 controls execution of the measurements made using one or more analog-to-digital converters or sensors coupled to DIG1, DIG2, . . . , DIGN. Controller 304 stores those measurements in registers (e.g., ON_MF, ON_RR1, ON_RR2, ON_RR3, ON_RR4, OFF_RR1, OFF_RR2, OFF_RR3, and OFF_RR4) and transfers the data to primary-side integrated circuit 201 for storage in corresponding locations in memory 324, which are readable by system controller 302. In at least one embodiment, controller 304 independently configures characteristics of On-State measurements and Off-State measurements with regard to Measurement Sequence Settling Time, Measure-First input selection, Post-Measure-First Delay time, Round-Robin Sequence Input Selection, Inter-Round-Robin Delay time, Round-Robin Sequence Resume location, and Round-Robin Repeat and Overwrite mode, as described further below.

Measurement Sequence Settling Time (ON_Settling, OFF_Settling)

In at least one embodiment, Measurement Sequence Settling Time specifies the time delay after a leading edge (e.g., a first edge of a pulse having an active level) of a corresponding On-State or Off-State, after which the first measurement of the associated measurement sequence should begin. The settling time is used to delay measurement until switching transients have died out. In at least one embodiment, ON_Settling specifies Measurement Sequence Settling Time for the On-State measurement sequence and OFF_Settling specifies the Measurement Sequence Settling Time for the Off-State measurement sequence. Two settling time modes are available: Fixed and Automatically Centered. In at least one embodiment, when Fixed mode is selected for either the On-State measurement sequence or the Off-State measurement sequence, a predetermined fixed settling time, i.e., $t_{ON}$_fixed or $t_{OFF}$_fixed, respectively, is used.

In at least one embodiment, if the Automatically Centered mode is selected for either the On-State measurement sequence or the Off-State measurement sequence, then controller 304 uses an automatically generated settling time, e.g., $t_{ON}$_center or $t_{OFF}$_center, respectively. If the duty-cycle of the synchronizing switching signal varies relatively slowly, then the duration of the current On-State or Off-State will be approximately the same as that of the preceding On-State or Off-State, respectively. In at least one embodiment, controller 304 measures the time of each On-State and Off-State and dynamically adjusts the $t_{ON}$_center and $t_{OFF}$_center times to equal one-half of the measured time of the preceding On-State and Off-State, respectively.

Measure-First Measurement Selection (ON_MF, OFF_MF)

In at least one embodiment, Measure-First Measurement Selection specifies the input signal assigned to a high-priority Measure-First Measurement Slot. If system controller 302 does not select an input for the Measure-First Measurement Slot, controller 304 skips any Measure-First Measurement and begins the measurement sequence with the Round-Robin Sequence. As referred to herein, a "Round-Robin Sequence" provides a time slot to each measurement in a circular order and "Measure-First Measurement" prioritizes measurement of a parameter with respect to the Round-Robin Sequence or other measurements of other parameters. Each of the On-State and Off-State measurement examples described below include a single Measure-First Measurement Slot, although multiple high-priority Measure-First measurement slots could be used.

Round-Robin Measurement Queue (ON_RR1, ON_RR2, ON_RRn, OFF_RR1, OFF_RR2, . . . , OFF_RRn)

In at least one embodiment, a Round-Robin Measurement Queue includes a number of Measurement Slots. Any, or none, of the input signals can be assigned to any of the Measurement Slots. The On-State and Off-State Round-Robin examples described herein each include four measurement Slots, labelled ON_RR1, ON_RR2, ON_RR3, and ON_RR4, and OFF_RR1, OFF_RR2, OFF_RR3, and OFF_RR4, respectively, although a different number of Round-Robin measurement slots is used in other embodiments.

Round-Robin Pick-Up Point (ON_RR_PU, OFF_RR_PU)

In at least one embodiment, controller 304 may interrupt a measurement in response to an occurrence of a trailing edge (i.e., a second edge of a pulse having an active level) of a corresponding On-State or Off-State. These interruptions may be unavoidable in applications where the synchronizing switching signal has a variable duty-cycle. During a subsequent On-State or Off-State, respectively, the measurement sequence will begin with the designated Measure-First measurement, and then return to the specified measurement of the Round-Robin Sequence. The point in the Round-Robin Sequence at which measurement resumes depends on the Round-Robin Pick-Up Point setting.

In at least one embodiment, if the Round-Robin Pick-Up Point for the On-State or Off-State (i.e., ON_RR_PU or OFF_RR_PU, respectively) is set to Where Left Off, then the Round-Robin Sequence resumes with the measurement that follows the last measurement that was completed during the preceding On-State or Off-State, respectively. In at least one embodiment, if the Round-Robin Pick-Up Point for the On-State or Off-State is set to Top of List, then the Round-Robin measurement sequence will resume with the measurement specified for the ON_RR1 or OFF_RR1 measurement slot, respectively, regardless of which measurement was completed last during the preceding On-State or Off-State, respectively.

Round-Robin Repeat and Overwrite Mode (ON_RR_Repeat, OFF_RR_Repeat)

In at least one embodiment, whether the Round-Robin Repeat and Overwrite Mode settings are enabled or disabled determines whether the Round-Robin Sequence continues if time remains in the ongoing On-State or Off-State after completion of one full cycle of the Round-Robin Sequence. In at least one embodiment, if the Repeat and Overwrite Mode for the On-State or Off-State (ON_RR_Repeat or OFF_RR_Repeat, respectively) is disabled, the measurement process stops after completion of one full cycle through the Round-Robin Sequence, even if time for additional measurements is available in the ongoing On-State or Off-State, respectively. In at least one embodiment, if the Repeat and Overwrite Mode for the On-State or Off-State is enabled, then the measurement process continues after completion of one full cycle through the Round-Robin Sequence, with new measurements overwriting (i.e., replacing) previous measurements made for the corresponding measurement slot. In at least one embodiment, the Repeat and Overwrite process continues until interrupted by the end (i.e., a trailing edge) of the ongoing On-State or Off-State.

Measurement Result Time Stamping and Storage

In an embodiment of a control system that uses a variable-duty-cycle switching signal, the time available to make measurements during the On-State or the Off-State is variable. Thus, any specific measurement that is scheduled in the measurement sequence for that On-State or Off-State may or may not be made during a given On-State or Off-State depending on the available time. Further, the nature of the Round-Robin Sequence makes determination of the time-order in which the measurements were taken ambiguous without some method of recording measurement times. In at least one embodiment, in order to allow identification of which measurements have been updated, controller 304 stores all measurement results in their corresponding result registers along with an accompanying timestamp. The time stamp represents the value of a running counter at the time the measurement was made. The time stamp allows identification of which measurements have been updated during the current On-State or Off-State. For example, system controller 302 determines updated measurements by comparing the timestamp for a specific measurement slot to a corresponding time stamp value from the previous On-State or Off-State. In at least one embodiment, the timestamp is implemented using a rolling counter that is incremented with every rising edge of the switching signal.

Parameter Usage Examples

Figure 5A:
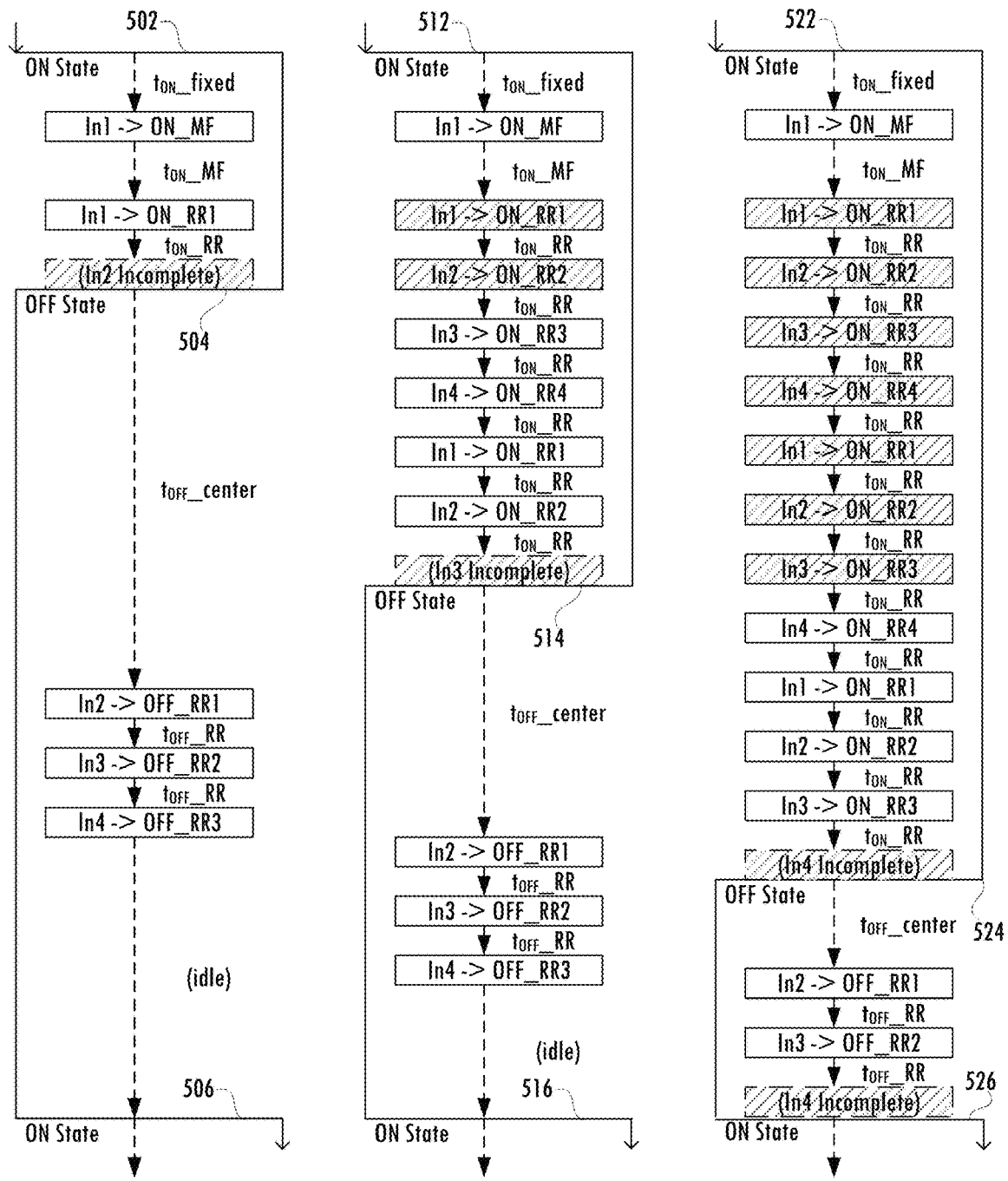
FIGS. 5A and 5B illustrates parameter usage examples of a measurement management technique synchronous to a control signal for a low, medium, and high duty cycle of the control signal consistent with at least one embodiment of the invention.
Figure 5B:
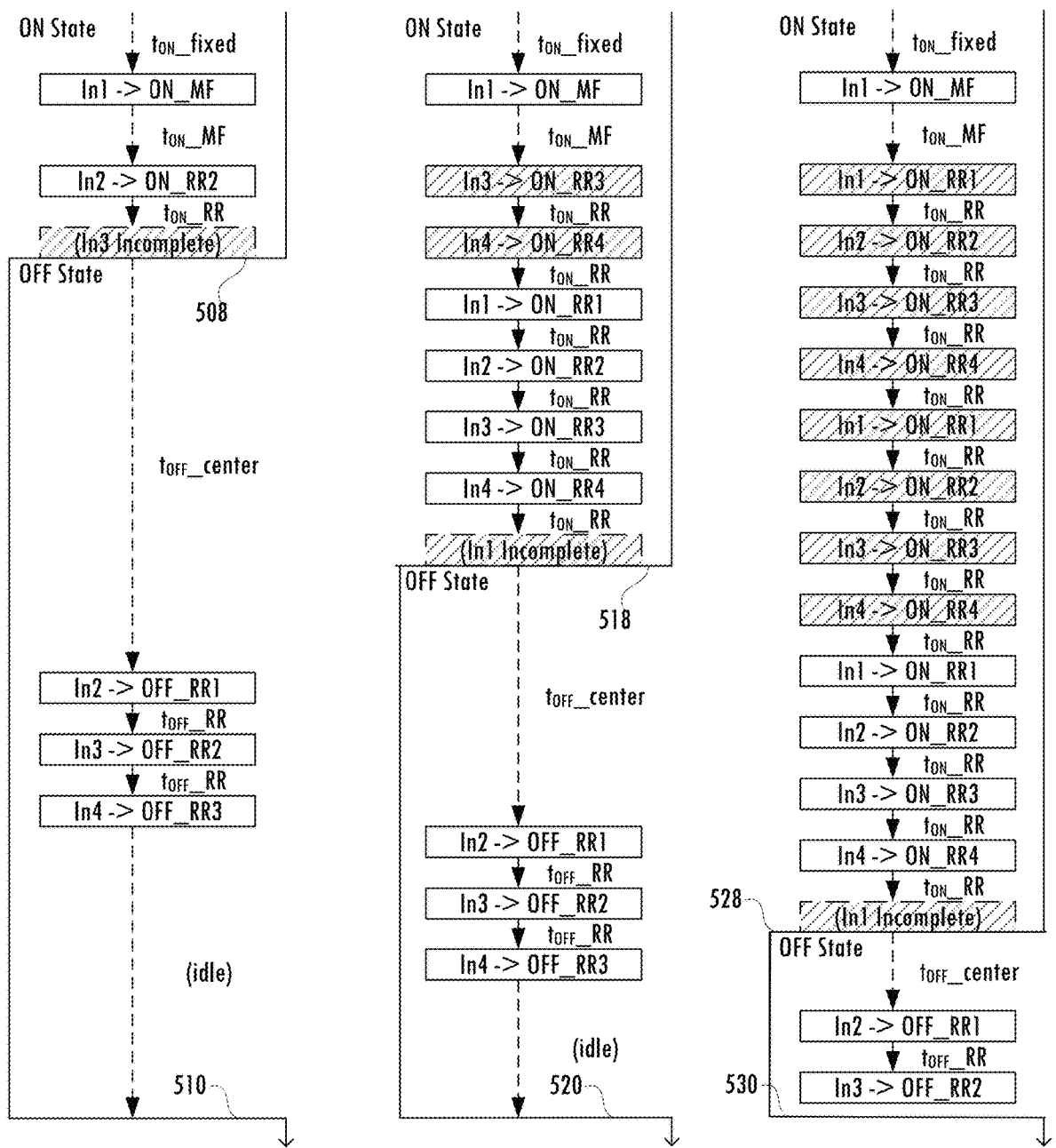

FIGS. 5A and 5B provide a graphical representation of exemplary measurement sequences for various parameter settings. Exemplary On-State measurement settings include Input 1 being selected for the Measure First slot for the On-State (i.e., ON_MF: mill). Input 1 is also included in the Round-Robin Sequence for the On-State, along with Input 2, Input 3, and Input 4. The On-State Round-Robin Sequence uses a fixed settling time (i.e., ON Settling: Fixed), a Round-Robin Pick-Up point setting of Where Left Off (i.e., ON_RR_PU: Where Left Off), and has the Round-Robin Repeat and Overwrite Mode Enabled (i.e., ON_RR Repeat: Enabled).

The Off-State Measurement Sequence in this example has no Measure First measurement (OFF_MF: (None)). The Off-State Round-Robin Sequence includes Input 2, Input 3, and Input 4. The Off State Settling Time in this case is set to Centered mode (i.e., OFF Settling: Centered), the Round-Robin Pick-Up Point is set to Top of List (i.e., OFF_RR_PU: Top of List), and Repeat and Overwrite is disabled for the Off-State measurements (i.e., OFF_RR Repeat: Disabled).

FIGS. 3, 5A and 5B provide examples of measurement sequences that would result from these settings for a synchronizing switching cycle with low duty cycle (e.g., less than 50%), medium duty cycle (e.g., 50%), and high duty cycle (e.g., greater than 50%), illustrated in the left column, center column, and right column, respectively. The low-duty-cycle sequence begins with low-to-high transition 502 of the synchronizing switching signal, which represents the leading edge of the On-State, triggering the On-State Measurement Sequence as follows:

after the settling time specified for $t_{ON}$_fixed, controller 304 measures Input 1 and stores the value in the On-State Measure First register location (In1→ON_MF), after measuring Input 1 and after the delay specified for $t_{ON}$_MF, controller 304 measures Input 1 and stores the value in the On-State Round-Robin Measurement 1 slot (In1→ON_RR1), and after measuring Input 1 again and after the delay specified for $t_{ON}$_RR, controller 304 initiates measurement of Input 2, but that measurement is interrupted by the trailing edge of the On-State (i.e., the high-to-low transition of the synchronizing switching control signal), as illustrated by hatching.

High-to-low transition 504 of the synchronizing switching control signal represents the leading edge of the Off-State and triggers the Off-State Measurement Sequence. The Off-State sequence differs from that of the On-State since the Off-State sequence is configured to have no Measure First measurement and uses a settling time setting of Automatically Centered:

after the settling time specified for $t_{OFF}$_center, controller 304 measures Input 2 and stores the value in the Off-State Round Robin Measurement 1 slot (In2→OFF_RR1), after measuring Input 2 and the delay specified for $t_{OFF}$_RR, controller 304 measures Input 3 and stores the value in the Off-State Round-Robin Measurement 2 slot (In3→OFF_RR2), after measuring Input 3, and the delay specified for $t_{OFF}$_RR, controller 304 measures Input 4 and stores the value in the Off-State Round-Robin Measurement 3 slot (In4→OFF_RR3).

Since the Off-State Round Robin sequence includes only these three measurements, this measurement completes a full cycle of the sequence.

Since the Repeat and Overwrite mode is Disabled for the Off-State Round-Robin Sequence, this measurement completes the Off-State measurement sequence.

Low-to-high transition 506 signals a return to the On-State, and the measurement sequence continues in response to high-to-low transition 508, low-to-high transition 510.

The center column of represents the measurement sequence when the duty-cycle of the synchronizing switching signal is 50%. Controller 304 begins the On-State measurement sequence as described above for the low-duty-cycle case. However, the 50% duty-cycle provides ample time in the On-State to complete the On-State Round-Robin Sequence, which includes Inputs 1 through 4. Since Repeat and Overwrite is enabled for the On-State, after measurement of Input 4 completes, the measurements begin to repeat, starting with Input 1. The remeasured values, along with their associated timestamps, replace (i.e., overwrite) the measurements or digital values recorded earlier. The measurement sequence continues until the end of the On-State (e.g., high-to-low transition 514). In this example, only the original values for the timeslots ON_RR1 and ON_RR2 are rewritten before the end of the On-State.

The Off-State measurement sequence for the 50% duty-cycle case is the same as for the low-duty-cycle example, since there is enough time prior to the low-to-high transition 506 or 516, respectively, to complete the non-repeating Off-State sequence in each case. The following On-State sequence between low-to-high transition 516 and high-to-low transition 518 is the same as the earlier On-State sequence between low-to-high transition 512 and high-to-low transition 514, with the prioritized measurement of Input 1 followed by resumption of the Round-Robin sequence. However, since the On-State Round-Robin Pick-Up Point is set to Where Left Off, the first measurement of the Round-Robin Sequence for the On-State after low-to-high transition 516 is the measurement of Input 3 for the ON_RR3 measurement slot.

The right column illustrates an exemplary measurement sequence for a high duty-cycle (e.g., greater than 50%) synchronizing switching signal. The On-State sequences between low-to-high transition 522 and high-to-low transition 524 and between low-to-high transition 526 and high-to-low transition 528 include more than one cycle of the Round-Robin Sequence and the Off-State sequences between high-to-low transition 524 and low-to-high transition 526 and between high-to-low transition 528 and low-to-high transition 530 include less than one cycle of the Round-Robin Sequence. Shaded measurements indicate that those measurements are not final measurements (e.g., measurements that are overwritten or measurements that are incomplete and therefore not saved).

Figure 6A:
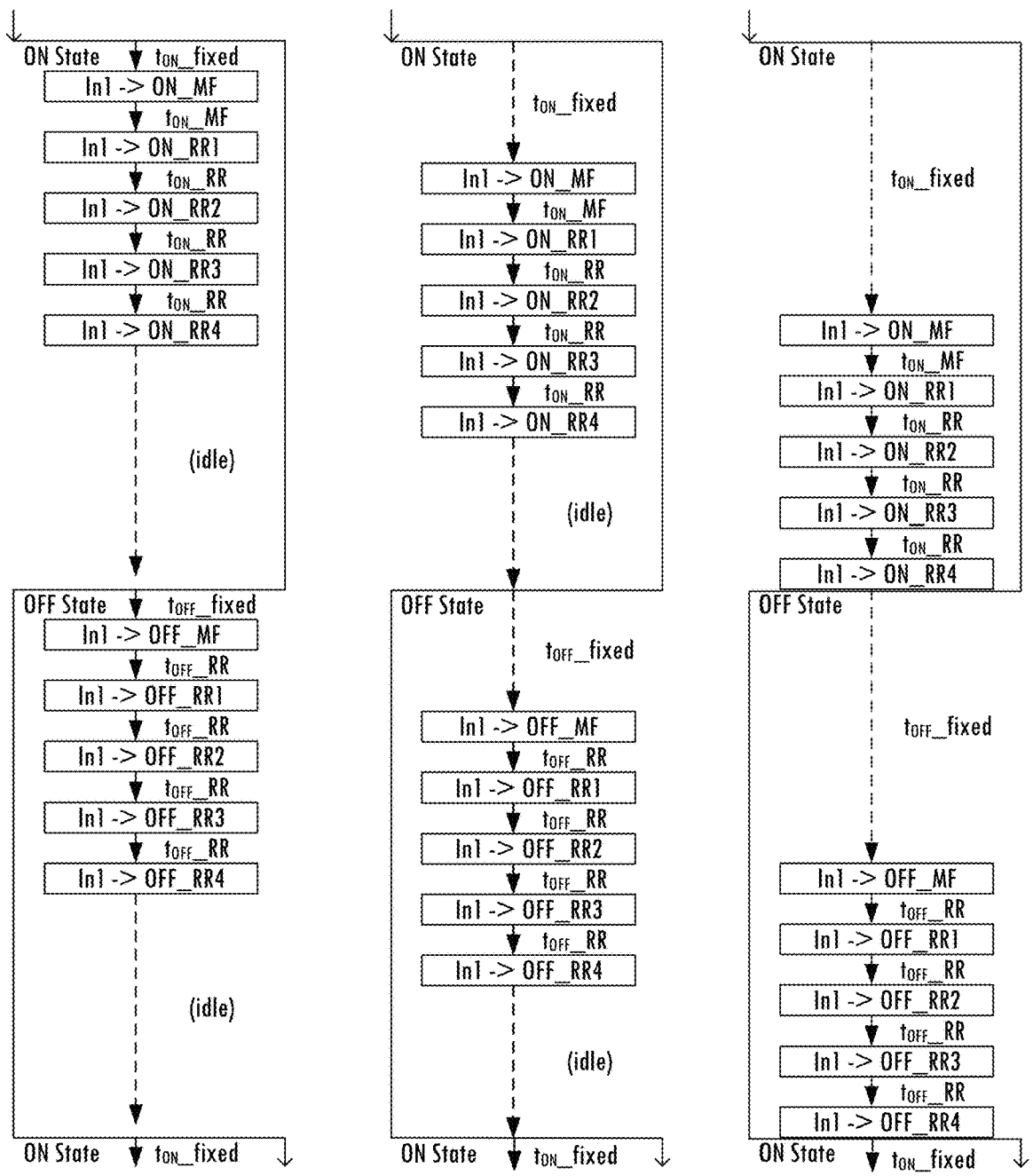
FIGS. 6A and 6B illustrate characterization usage examples of a measurement management technique synchronous to a control signal with a 50% duty cycle consistent with at least one embodiment of the invention.
Figure 6B:
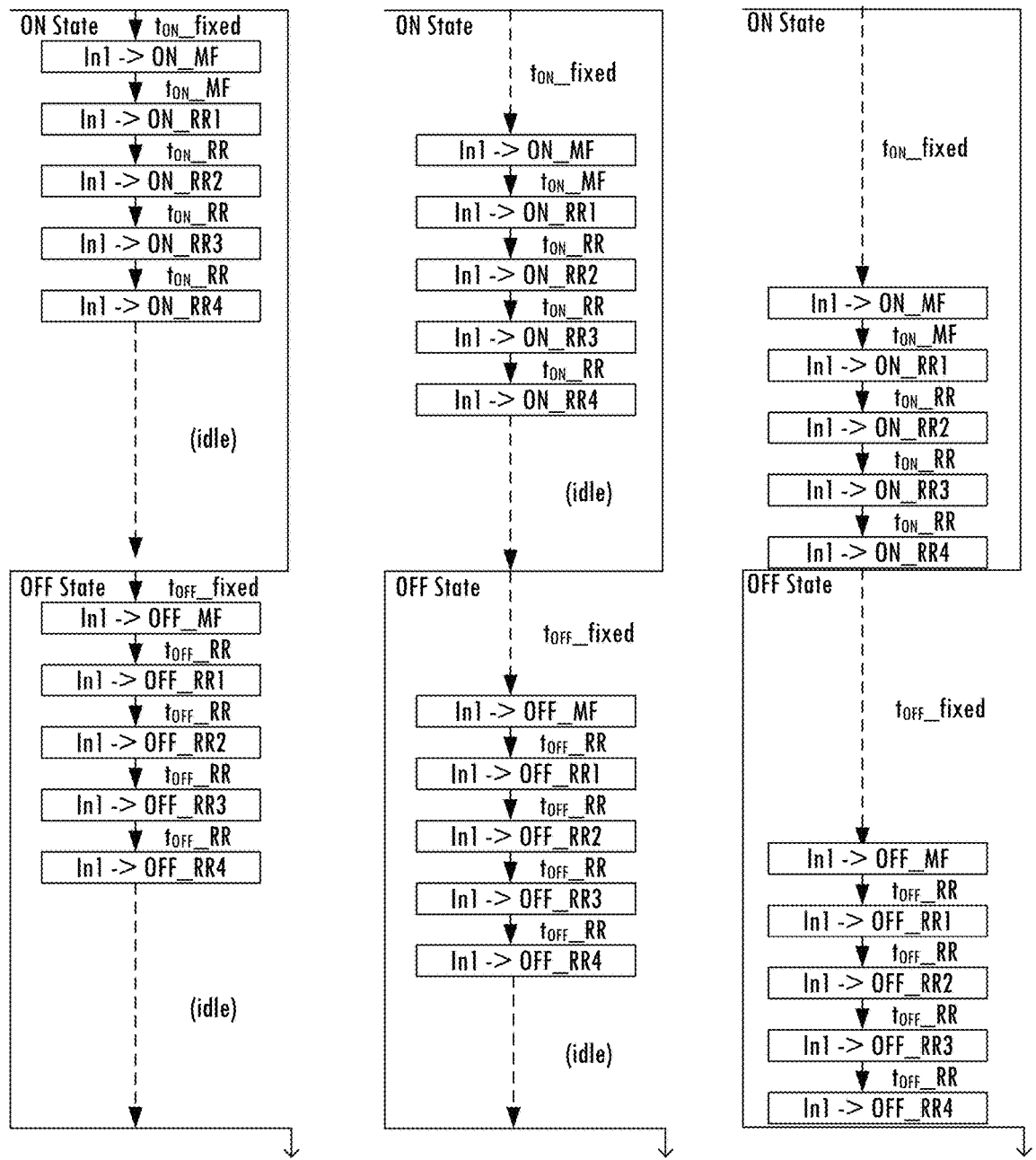

FIGS. 6A and 6B illustrate an exemplary configuration of the measurement technique to facilitate characterization of system performance. The goal of this configuration is to make multiple sequential measurements of a signal to characterize how the signal changes over time. Such measurements can be used, for example, to determine the time required for a voltage to stabilize after a switching edge, or to characterize the effect of a gate driver turn-on or turn-off strength adjustment on the gate voltage or switching current of a high-power drive device.

In an embodiment, this configuration assigns the same input signal (e.g, Input 1) to the Measure-First measurement and all of the Round-Robin measurement of the On-State and/or Off-State in order to secure as many measurements of the signal as possible. The Settling time is set to Fixed, which determines when the measurements should begin and is programmed to control the time after the leading edge of the On-State and/or Off-State. The $t_{ON}$_MF and $t_{ON}$_RR timing parameters (and/or $t_{OFF}$_MF and $t_{OFF}$_RR for the Off-State) are set to small values to focus the sequence of measurements into the specific time frame of interest. The Round-Robin Pick-Up Point is set to "Top of List", and Repeat and Overwrite is disabled, to achieve a single, sequential set of measurements. The three columns of FIGS. 6A and 6B show how the cluster of measurements used for characterization can be located at different times within the On-State and Off-State by changing the settling time settings $t_{ON}$_fixed and $t_{OFF}$_fixed. Although configurations of FIGS. 6A and 6B show the duty-cycle being a constant 50% for a characterization involving Input 1, this is not a requirement, and other duty cycles may be used.

Figure 7A:
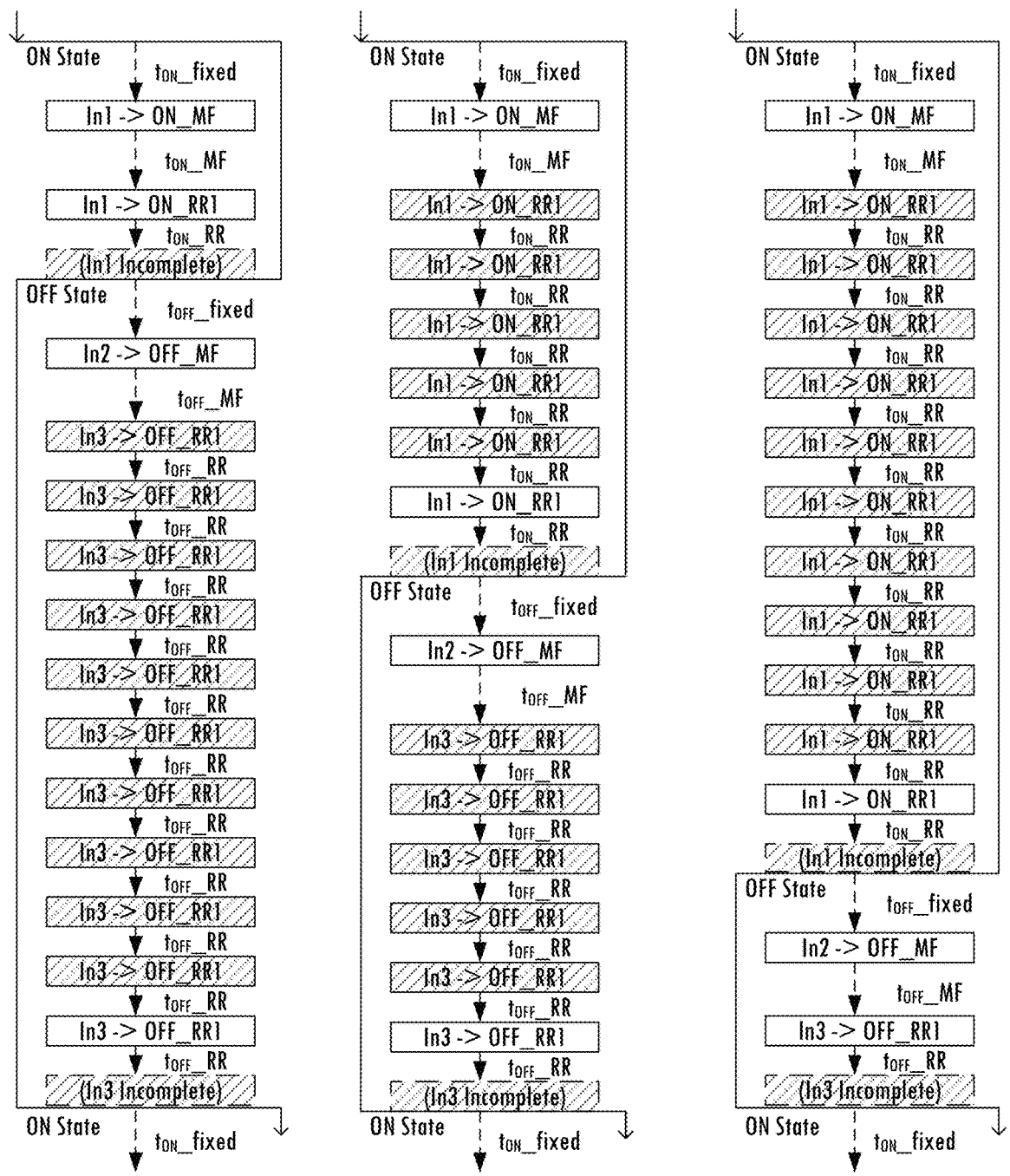
FIGS. 7A and 7B illustrate leading edge and trailing edge measurement examples of a measurement management technique synchronous to a control signal for a low, medium, and high duty cycle of the control signal consistent with at least one embodiment of the invention.
Figure 7B:
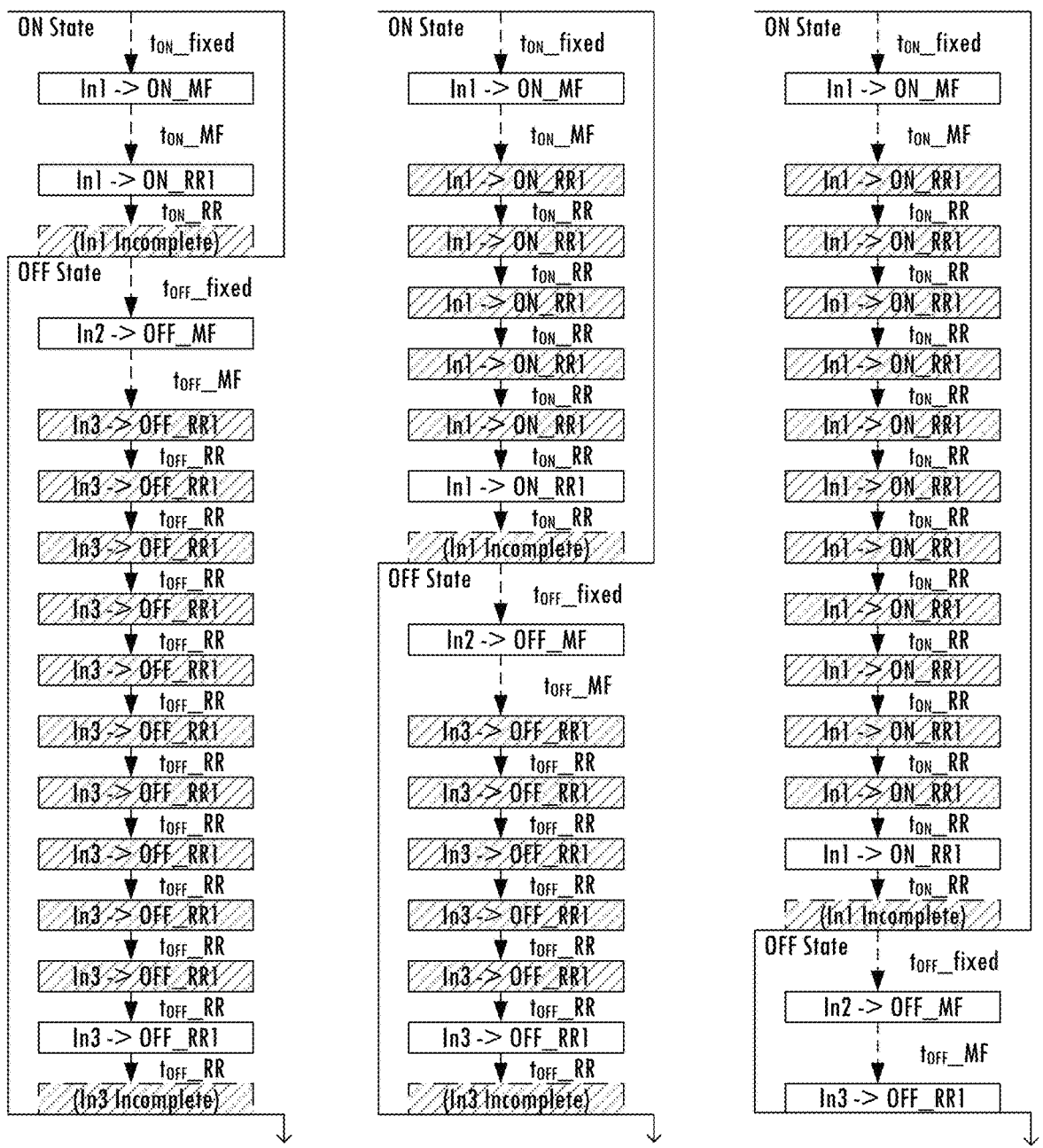

In some cases, it is desirable to obtain measurements both near the beginning of an On-State (or Off-State) and near the end of the On-State (or Off-State), but is not easily achievable using conventional measurement techniques involving single measurements or Round-Robin measurements alone. However, this is easily done using the measurement management method described herein. Further, the leading edge measurement and the trailing edge measurement may be made on the same input source or on different input sources, as illustrated in FIGS. 7A and 7B for low duty cycle, 50% duty cycle, and high duty cycle synchronizing switching signals. FIGS. 7A and 7B illustrate measurements at the beginning and at the end of the On-State or Off-State.

In this example the Measure First measurements obtain measurements near the beginning of the On-State or Off-State. Fixed settling times $t_{ON}$_fixed and $t_{OFF}$_fixed determine how close those measurements are to the beginning of the corresponding states. Measurements near the end of the On-State and Off-State are obtained using a Round-Robin measurement sequence with Repeat and Overwrite enabled. In the examples illustrated here, only one measurement is specified for the On-State Round-Robin sequence, so the same measurement is repeated until the end of the On-State. The result from each new measurement, along with the associated timestamp, overwrite the previously captured result (illustrated by shading in FIGS. 7A and 7B), leaving a final value that was measured as near the end of the On-State as possible. The same technique is used with the Off-State Round-Robin sequence to obtain a measured value that was captured as near to the end of the Off-State as possible.

For the On-State, the input source for the Measure-First and for the Round-Robin measurement is Input 1, resulting in measurement of Input 1 being captured at the beginning and at the end of the On-State. For the Off-State case Input 2 is selected for the Measure First, and Input 3 is selected for the Round-Robin input, resulting in a measurement of Input 2 from the beginning of the Off-State and a measurement of Input 3 from the end of the Off-State.

Figure 8A:
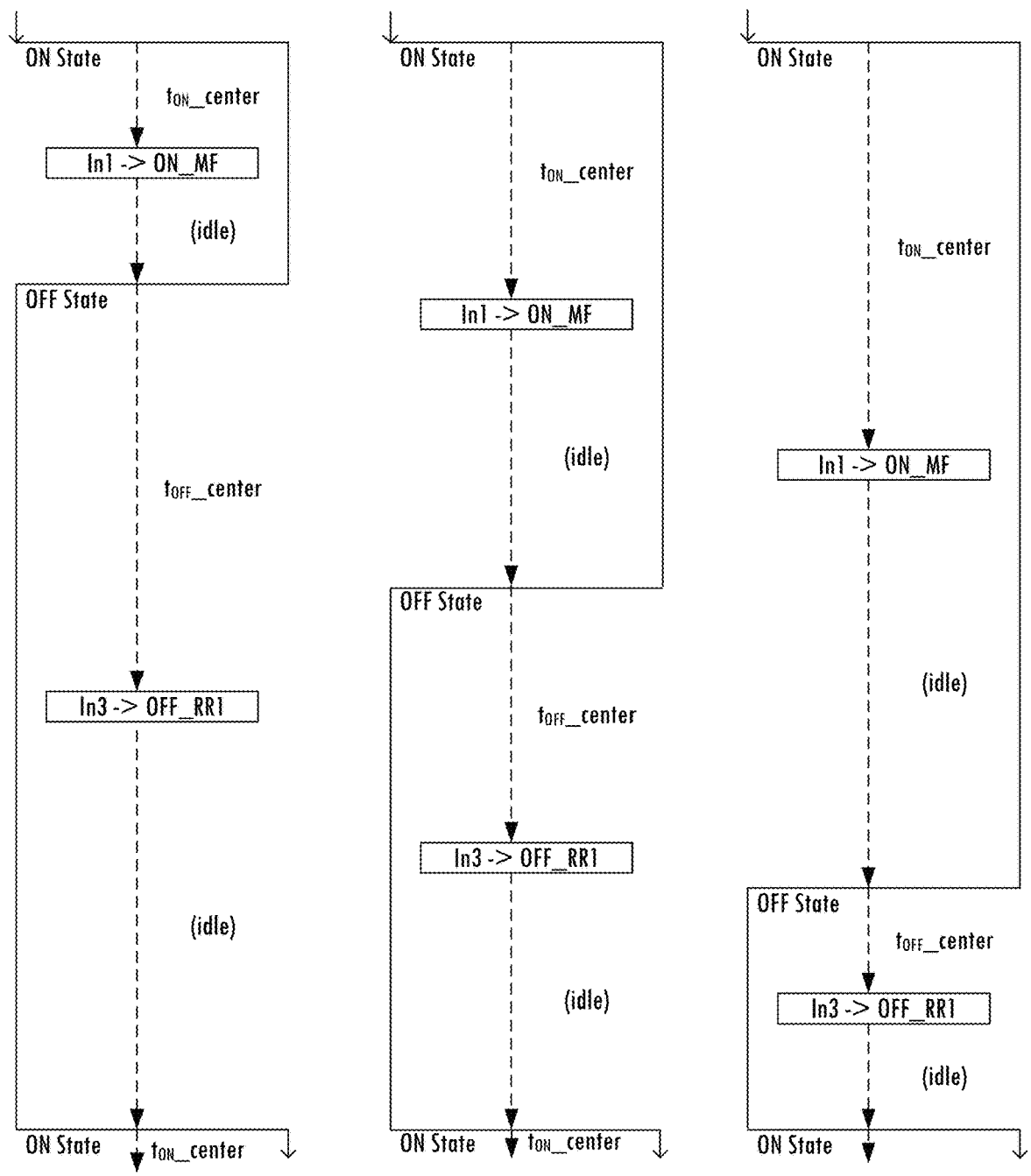
FIGS. 8A and 8B illustrates examples of a Center-Only measurement management technique synchronous to a control signal for a low, medium, and high duty cycle of the control signal consistent with at least one embodiment of the invention.
Figure 8B:
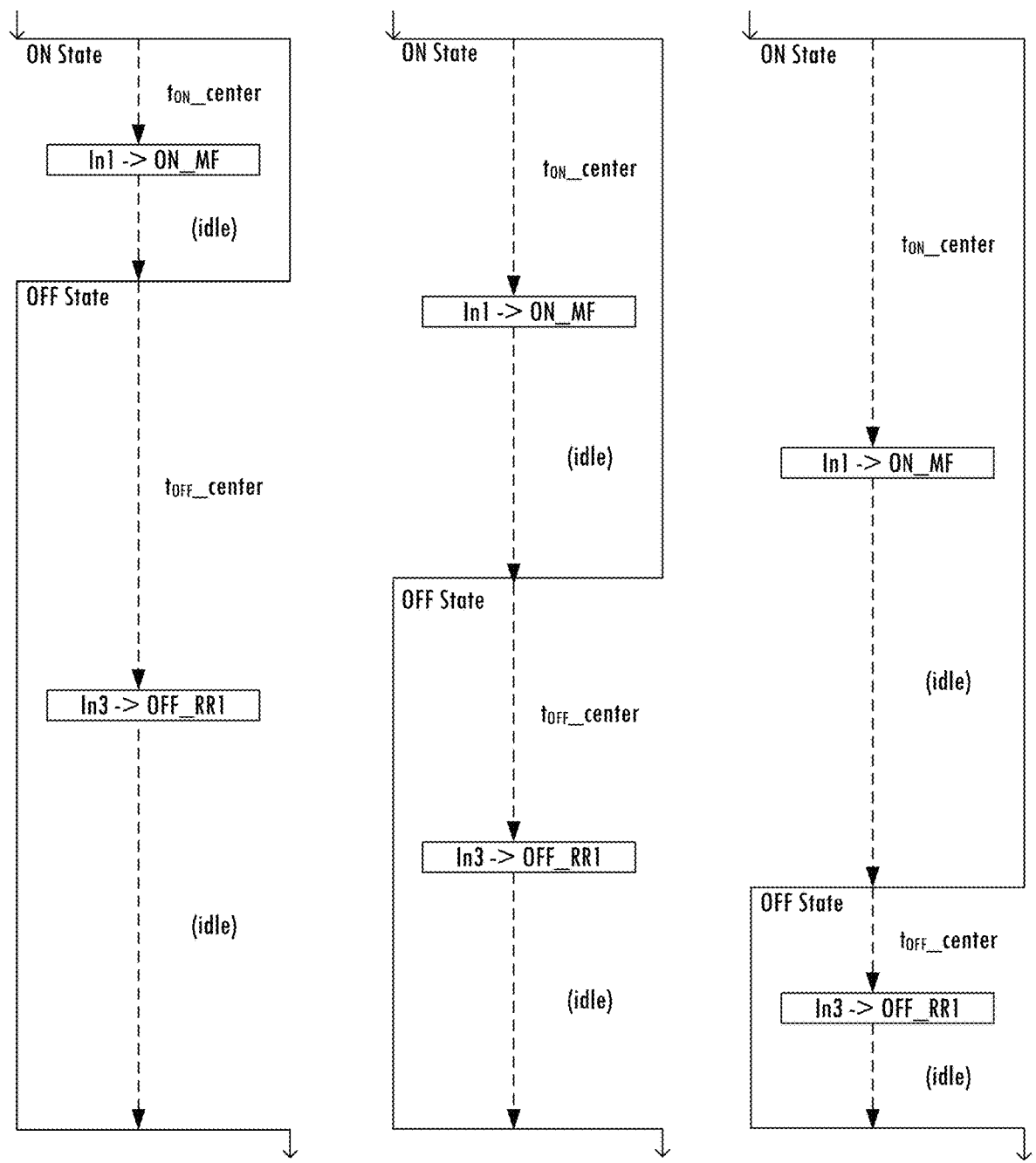

FIGS. 8A and 8B illustrate a Center-Only example that illustrates how the measurement management system can be used to capture a single measurement in the estimated center of the On-State and/or Off-State for low duty cycle, 50% duty cycle, and high duty cycle synchronizing switching signals. This type of centered measurement is useful in applications such as three-phase motor control where the center of the On-State and Off-States represent quiet times where minimal switching transients typically occur.

The measurement management system achieves centered measurements, as illustrated in FIGS. 8A and 8B, using a configuration that makes a single measurement in the On-State or Off-State and has a Settling Time set to Automatically Centered. The On-State measurement uses the Measure First measurement slot as the single measurement; no measurement slots are enabled for the On-State Round-Robin sequence. The Off-State measurement sequence uses a different configuration to achieve the same result. In the Off-State case, the Measure First measurement is not used, and only one of the Round-Robin measurement slots is configured to make the measurement.

Thus, techniques for managing switching synchronized measurements using a combination of prioritized measurement and round-robin sequence measurements are disclosed. Structures described herein may be implemented using software executing on a processor (which includes firmware) or by a combination of software and hardware. Software, as described herein, may be encoded in at least one tangible (i.e., non-transitory) computer readable medium. As referred to herein, a tangible computer-readable medium includes at least a disk, tape, or other magnetic, optical, or electronic storage medium.

The description of the invention set forth herein is illustrative and is not intended to limit the scope of the invention as set forth in the following claims. For example, while the invention has been described in an embodiment in which a gate driver product is configured for power conversion and motor control, one of skill in the art will appreciate that the teachings herein can be utilized with other applications. In addition, while the invention has been described in an embodiment in which a gate driver product includes a DC-to-DC controller, one of skill in the art will appreciate that the teachings herein can be utilized with a gate driver without an integrated DC-to-DC controller. Although signals and responses are described regarding specific edge polarities (e.g., rising edge or positive edge for a transition from a low logic level to a high logic level and falling edge or negative edge for a transition from a high logic level to a low logic level) other combinations of edge polarities may be used. The terms "first," "second," "third," and so forth, as used in the claims, unless otherwise clear by context, is to distinguish between different items in the claims and does not otherwise indicate or imply any order in time, location, or quality. For example, "a first signal" or "a second signal" does not indicate or imply that the first received network signal occurs in time before the second received network signal. Variations and modifications of the embodiments disclosed herein may be made based on the description set forth herein, without departing from the scope of the invention as set forth in the following claims.

What is claimed is:

1. A method for managing measurements in a gate driver system, the method comprising:
   with a gate driver integrated circuit, generating a switching signal that transitions according to a variable duty cycle between a first state and a second state;
   in response to the switching signal transitioning from the second state to the first state, taking one or more higher priority measurements of the gate driver system according to a first priority schedule; and
   after taking the one or more higher priority measurements according to the first priority schedule, and prior to a next transition of the switching signal from the first state to the second state, taking one or more lower priority measurements of the gate driver system according to a second priority schedule.

2. The method of claim 1 wherein the first priority schedule includes a single measurement slot, and the second priority schedule includes a sequenced plurality of measurements slots.

3. The method as recited in claim 1 further comprising, in response to a next transition of the switching signal from the first state to the second state, taking one or more measurements of the gate driver system according to a third priority schedule.

4. The method of claim 3 wherein the one or more measurements of the gate driver system taken according to the third priority schedule include one or more higher priority measurements, and the method further comprises, after taking the one or more higher priority measurements according to the third priority schedule, and prior to a next transition of the switching signal from the second state to the first state, taking one or more lower priority measurements of the gate driver system according to a fourth priority schedule.

5. The method of claim 1 further comprising:
in response to a next transition of the switching signal from the second state to the first state, retaking one or more higher priority measurements according to the first priority schedule; and
after retaking the one or more higher priority measurements, and prior to a next transition of the switching signal from the first state to the second state, resuming the second priority schedule to take one or more lower priority measurements of the gate driver system and complete execution of the second priority schedule, which was partially completed when the switching signal was previously in the first state.

6. The method of claim 1 wherein the first state is an on-state of a high-power drive device coupled to the gate driver integrated circuit and the second state is an off-state of the high-power drive device.

7. The method of claim 1 further comprising:
after completing the second priority schedule, and prior to a next transition of the switching signal transitioning from the first state to the second state, retaking the one or more lower priority measurements according to a second iteration of the second priority schedule; and
overwriting a stored measurement of one or more lower priority measurements with a measurement taken during the retaking of the one or more lower priority measurements.

8. The method of claim 1 wherein the one or more higher priority measurements are of a current or a voltage associated with a high-power drive device measured using a terminal of the gate driver integrated circuit.

9. The method of claim 1 wherein the switching signal is pulse-width modulated.

10. A gate driver system comprising:
a driver circuit of an integrated circuit; and
a controller circuit of the integrated circuit configured, in response to a switching signal having a variable duty cycle transitioning from a second state to a first state, to cause the integrated circuit to take one or more higher priority measurements of the gate driver system according to a first priority schedule, and further configured, after the one or more higher priority measurements according to the first priority schedule are taken, and prior to a next transition of the switching signal from the first state to the second state, to cause the integrated circuit to take one or more lower priority measurements of the gate driver system according to a second priority schedule.

11. The gate driver system of claim 10 further comprising:
a gate driver product having a high-voltage side and a low-voltage side, the high-voltage side including the integrated circuit;
an isolation barrier between the high-voltage side and the low-voltage side;
an isolation communications channel configured to communicate information between the high-voltage side and the low-voltage side; and
an analog-to-digital converter disposed on the high-voltage side of the gate driver product.

12. The gate driver system of claim 10 wherein the first priority schedule includes a single measurement slot, and the second priority schedule includes a sequenced plurality of measurements slots.

13. The gate driver system of claim 10 wherein the controller circuit is further configured, in response to a next transition of the switching signal from the first state to the second state, to cause the integrated circuit to take one or more measurements of the gate driver system according to a third priority schedule.

14. The gate driver system of claim 13 wherein the one or more measurements of the gate driver system taken according to the third priority schedule include one or more higher priority measurements, and the controller circuit is further configured, after the one or more higher priority measurements according to the third priority schedule are taken, and prior to a next transition of the switching signal from the second state to the first state, to cause the integrated circuit to take one or more lower priority measurements of the gate driver system according to a fourth priority schedule.

15. The gate driver system of claim 10 wherein the controller circuit is further configured:
in response to a next transition of the switching signal from the second state to the first state, to cause the integrated circuit to retake the one or more higher priority measurements according to the first priority schedule; and
after the one or more higher priority measurements are retaken, and prior to a next transition of the switching signal from the first state to the second state, to cause the integrated circuit to resume the second priority schedule by taking one or more lower priority measurements of the gate driver system that were not taken during execution of the second priority schedule when the switching signal was last in the first state.

16. The gate driver system of claim 10 wherein the first state is an on-state of a high-power drive device coupled to the gate driver system and the second state is an off-state of the high-power drive device.

17. The gate driver system of claim 10 wherein the controller circuit is further configured:
after completion of the second priority schedule, and prior to a next transition of the switching signal from the first state to the second state, to cause the integrated circuit to retake the one or more lower priority measurements according to a second iteration of the second priority schedule; and
to cause the integrated circuit to overwrite a stored measurement of one or more lower priority measurements with a measurement taken during the retaking of the one or more lower priority measurements.

18. A gate driver system comprising:
a driver circuit of an integrated circuit; and
a controller circuit of the integrated circuit configured to cause the integrated circuit to measure one or both of a current through a high-power drive device and a voltage across the high-power drive device according to a first priority schedule responsive to a first edge of a switching signal having a variable duty cycle, and further configured, after the measurement of the one or both of the current and the voltage and prior to a next edge of the switching signal, to cause the integrated circuit to measure additional parameters according to a first round-robin schedule responsive to the first edge of the switching signal.

19. The gate driver system of claim 18 wherein the controller circuit is further configured to adjust a control signal driving the high-power drive device based on digital representations of one or both of the current and the voltage.

20. The gate driver system of claim 18 wherein the controller circuit is further configured to cause the integrated circuit to measure one or both of the current through the high-power drive device and the voltage across the high-power drive device according to a second priority schedule synchronously to a second edge of the switching signal, the first priority schedule and the first round-robin schedule corresponding to an on-state of the high-power drive device and the second priority schedule and a second round-robin schedule corresponding to an off-state of the high-power drive device, and the controller circuit is further configured to, after measurement of the current and the voltage and prior to a next second edge of the switching signal, to cause the integrated circuit to measure second additional parameters according to the second round-robin schedule responsive to a next second edge of the switching signal.

* * * * *